United States Patent
Iwashita (10) Patent No.: US 9,680,491 B2
(45) Date of Patent: Jun. 13, 2017

(54) SIGNAL PROCESSING CIRCUIT

(71) Applicant: YOKOGAWA ELECTRIC CORPORATION, Tokyo (JP)

(72) Inventor: Junichi Iwashita, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 15/251,619

(22) Filed: Aug. 30, 2016

(65) Prior Publication Data

US 2017/0093417 A1 Mar. 30, 2017

(30) Foreign Application Priority Data

Sep. 24, 2015 (JP) ................................ 2015-186992

(51) Int. Cl.
*H03M 1/12* (2006.01)
*G06F 13/42* (2006.01)

(52) U.S. Cl.
CPC .......... *H03M 1/12* (2013.01); *G06F 13/4247* (2013.01)

(58) Field of Classification Search
None
See application file for complete search history.

(56) References Cited

U.S. PATENT DOCUMENTS

| | | | |
|---|---|---|---|
| 5,928,345 A * | 7/1999 | Tetzlaff | G05B 15/02 340/3.5 |
| 6,456,219 B1 | 9/2002 | Schreiber et al. | |
| 7,728,753 B2 * | 6/2010 | Taft | H03M 1/0624 341/165 |
| 7,948,423 B2 | 5/2011 | Taft et al. | |
| 8,478,917 B2 * | 7/2013 | Scott | G06F 13/4247 710/104 |
| 8,731,002 B2 * | 5/2014 | Pan | G06F 13/4256 370/503 |

FOREIGN PATENT DOCUMENTS

EP 1 983 650 A1 10/2008

OTHER PUBLICATIONS

Texas Instruments; Goswami et al.; Using ADS8410/13 in Daisy-Chain Mode, Application Report SLAA296, May 2006.*
Intersil Data Sheet ISL78600, Intersil, Apr. 2016.*
Usach, M., SPI Interface, Analog Devices, Application Note AN-1248, circa Sep. 2015.*

(Continued)

*Primary Examiner* — Howard Williams
(74) *Attorney, Agent, or Firm* — Sughrue Mion, PLLC (57) ABSTRACT

A signal processing circuit includes: a plurality of daisy chain-connected AD converters each including a data ready output terminal, a synchronizing signal input terminal, and a serial clock input terminal; a calculator connected to the data ready output terminal of any of the AD converters and for outputting a serial clock to the serial clock input terminal of each of the AD converters when a data ready signal is input; and a reset processor included in the calculator and for outputting a synchronizing signal to the synchronizing signal input terminal of each of the AD converters when an output time lag among data ready signals from each of the AD converters is detected for a predetermined number of times.

4 Claims, 9 Drawing Sheets

(56) References Cited

OTHER PUBLICATIONS

Texas Instruments Incorporated, "24-Bit, Wide Bandwidth Analog-to-Digital Converter" ADS1271 Data sheet Rev.B, Nov. 2004—Revised Oct. 2007, p. 24, Search on Aug. 18, 2015, Internet (URL:http://www.tij.co.jp/jp/lit/ds/symlink/ads1271.pdf).

Jwu-Sheng Hu et al: "Sound source tracking and speech enhancement by microphone array on an embedded dual-core processor platform", Advanced Robotics and Its Social Impacts, 2008. ARSO 2008. IEEE Workshop on, IEEE, Piscataway, NJ, USA, Aug. 23, 2008 (Aug. 23, 2008), pp. 1-6, XP031350333, DOI: 10.1109/ARSO.2008.4653624 ISBN: 978-1-4244-2674-4.

\* cited by examiner

SIGNAL PROCESSING CIRCUIT

CROSS-REFERENCE TO RELATED APPLICATION

This application claims priority from Japanese Patent Application No. 2015-186992 filed with the Japan Patent Office on Sep. 24, 2015, the entire content of which is hereby incorporated by reference.

BACKGROUND

1. Technical Field

The present disclosure relates to a signal processing circuit.

2. Description of the Related Art

An AD converter accommodated to daisy chain connection has been put into practical use. Such a converter is described in the following literature, for example. Texas Instruments Incorporated, 24-Bit, Wide Bandwidth Analog-to-Digital Converter ADS1271 Data sheet Rev.B, November 2004—Revised October 2007, p.24, Search on Aug. 18, 2015, Internet (URL:http://www.tij.co.jp/jp/lit/ds/symlink/ads1271.pdf)

Figure 7:
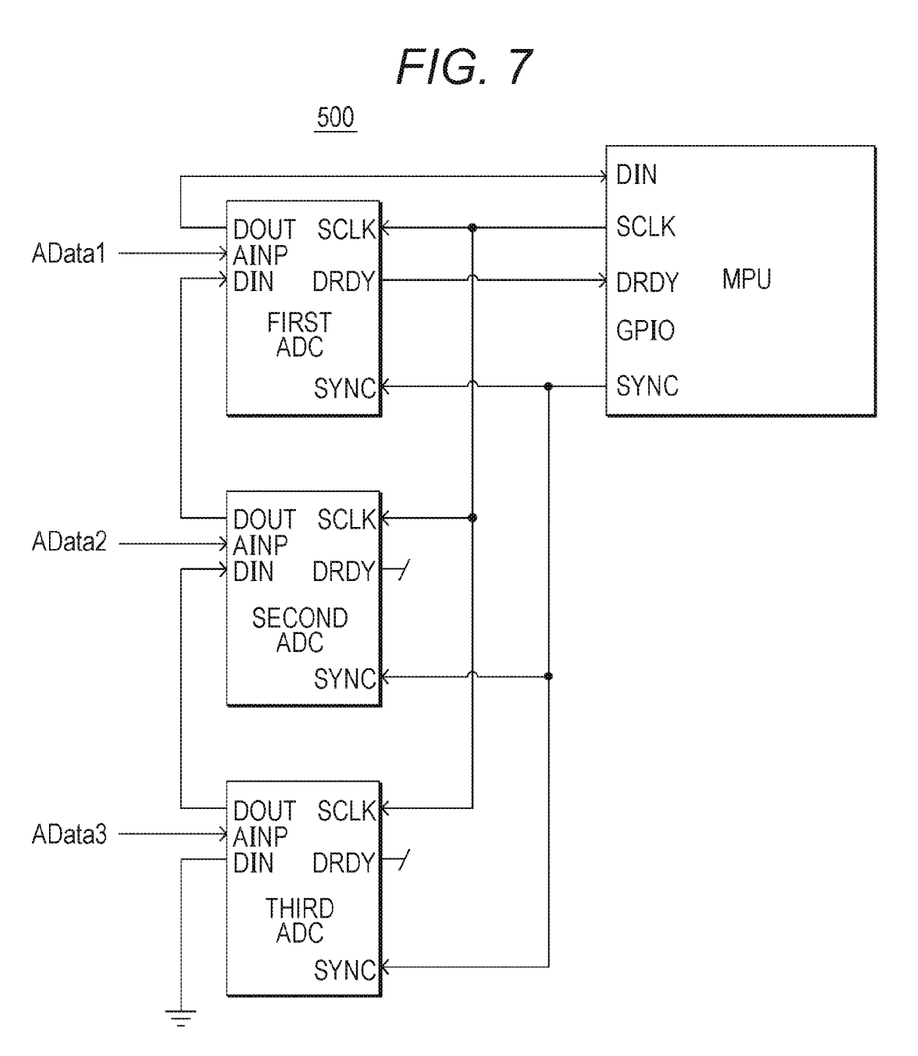
FIG. 7 illustrates a signal processing circuit including daisy chain-connected AD converters.

FIG. 7 illustrates a signal processing circuit 500 including daisy chain-connected AD converters. In the signal processing circuit 500, it is assumed that each AD converter is required to perform digital conversion at the same timing.

In the example of FIG. 7, three AD converters (first ADC, second ADC, and third ADC) are daisy chain-connected. An MPU retrieves serial digital data. Due to daisy chain connection, it is possible to simplify serial interface for digitally converting several analog data to retrieve as serial data.

Each ADC includes an analog input terminal (AINP), a digital output terminal (DOUT), a digital input terminal (DIN), a synchronizing signal input terminal (SYNC), a serial clock input terminal (SCLK), and a data ready output terminal (DRDY).

An MPU includes a digital input terminal (DIN), a serial clock output terminal (SCLK), a data ready input terminal (DRDY), a general-purpose input output terminal (GPIO), and a synchronizing signal output terminal (SYNC).

Each ADC becomes a reset state when a negative pulse is applied to the synchronizing signal input terminal (SYNC). In the example of FIG. 7, a synchronizing signal pulse is output from the synchronizing signal output terminal (SYNC) of the MPU. The synchronizing signal pulse is concurrently applied to the synchronizing signal input terminal (SYNC) of each ADC. Each ADC is simultaneously reset when the MPU outputs a synchronizing signal pulse after the power is turned on. Accordingly, conversion of each ADC is synchronized.

Thereafter, each ADC converts analog data input to each analog input terminal (AINP) to digital data at the same timing. Moreover, each ADC shifts out conversion data (digital data) from the digital output terminal (DOUT) at a falling edge of the SCLK. SCLK is output from the serial clock output terminal (SCLK) of the MPU. SCLK is concurrently input to the serial clock input terminal (SCLK) of each ADC.

The daisy chain-connected ADCs shift in digital data from the digital input terminal (DIN) at a falling edge of the SCLK. The data that has been shifted in is shifted out from the digital output terminal (DOUT) after the conversion data is shifted out.

In the example of FIG. 7, the digital output terminal (DOUT) of the first ADC is connected to the digital input terminal (DIN) of the MPU. The digital output terminal (DOUT) of the second ADC is connected to the digital input terminal (DIN) of the first ADC. The digital output terminal (DOUT) of the third ADC is connected to the digital input terminal (DIN) of the second ADC. The digital input terminal (DIN) of the third ADC is grounded.

The ADC sets the data ready output terminal (DRDY) as low level when it is data-ready for reading (that is, when it is ready to read data). Only the data ready output terminal (DRDY) of the first ADC is connected to the data ready input terminal (DRDY) of the MPU.

Figure 8:
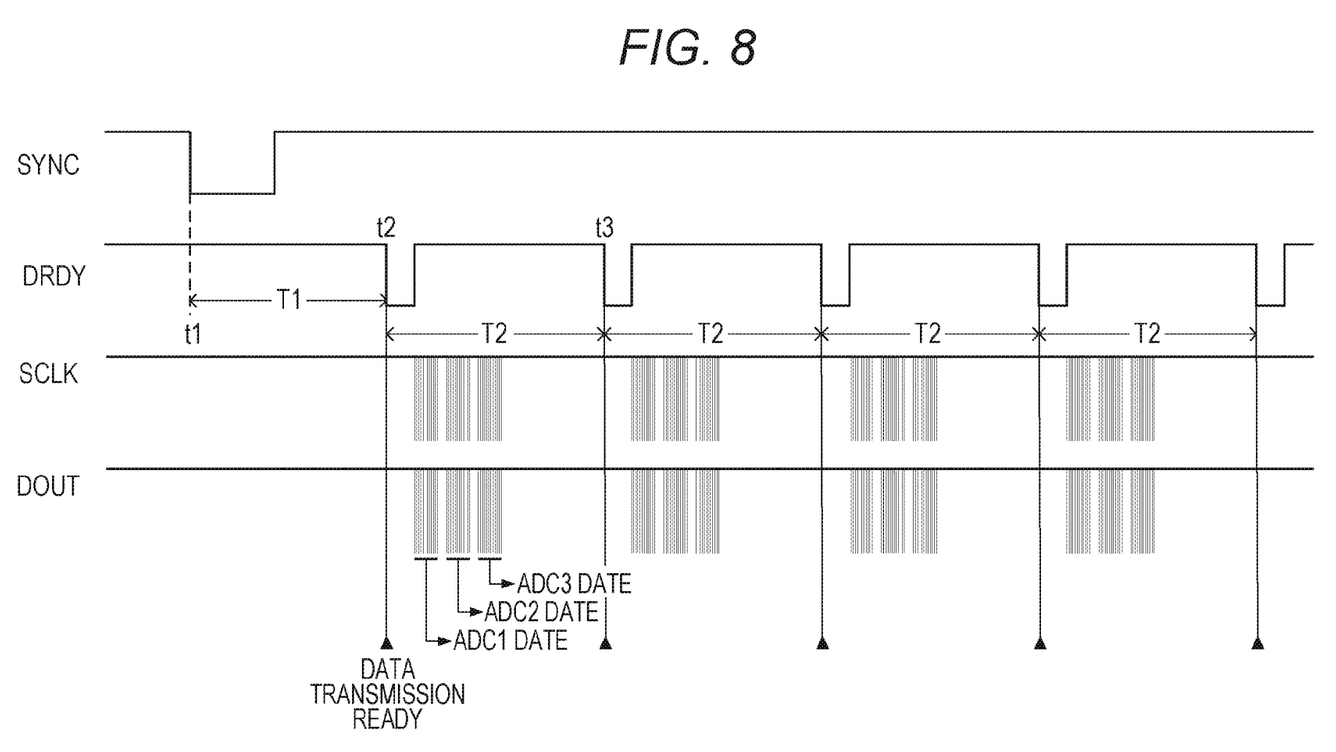
FIG. 8 is a timing chart showing an operation of a signal processing circuit known to the inventors.

FIG. 8 is a timing chart for describing an operation of the signal processing circuit 500. As shown in FIG. 8, each ADC is simultaneously reset when a pulse is concurrently applied to the synchronizing signal input terminal (SYNC) at a time t1. Each ADC performs digital conversion at the same timing and outputs a DRDY signal at a time t2 after a predetermined period T1. The MPU only receives a DRDY signal output from the first ADC.

The MPU outputs SCLK to each ADC when the MPU receives a DRDY signal. Each ADC shifts out digital data at an edge of the SCLK. Due to daisy chain connection, the MPU sequentially acquires output data of the first ADC (ADC 1 data), output data of the second ADC (ADC 2 data), and output data of the third ADC (ADC 3 data) from the digital output terminal (DOUT) of the first ADC.

Subsequently, each ADC performs digital conversion at the same timing to output a DRDY signal for each predetermined period T2. Each ADC shifts out digital data at an edge of the SCLK output from the MPU in accordance with the DRDY signal. Each ADC repeats the above process.

SUMMARY

A signal processing circuit includes: a plurality of daisy chain-connected AD converters each including a data ready output terminal, a synchronizing signal input terminal, and a serial clock input terminal; a calculator connected to the data ready output terminal of any of the AD converters and for outputting a serial clock to the serial clock input terminal of each of the AD converters when a data ready signal is input; and a reset processor included in the calculator and for outputting a synchronizing signal to the synchronizing signal input terminal of each of the AD converters when an output time lag among data ready signals from each of the AD converters is detected for a predetermined number of times.

DESCRIPTION OF THE EMBODIMENTS

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In a signal processing circuit 500 illustrated in FIG. 7, a noise may be contained according to usage environment or the like. The contained noise may be superimposed on each signal. If a noise is superimposed on a SYNC signal of the signal processing circuit 500, a phenomenon may occur in which an essentially unnecessary reset is applied to a part of AD converters while a reset is not applied to other AD converters according to a state of the noise.

Figure 9:
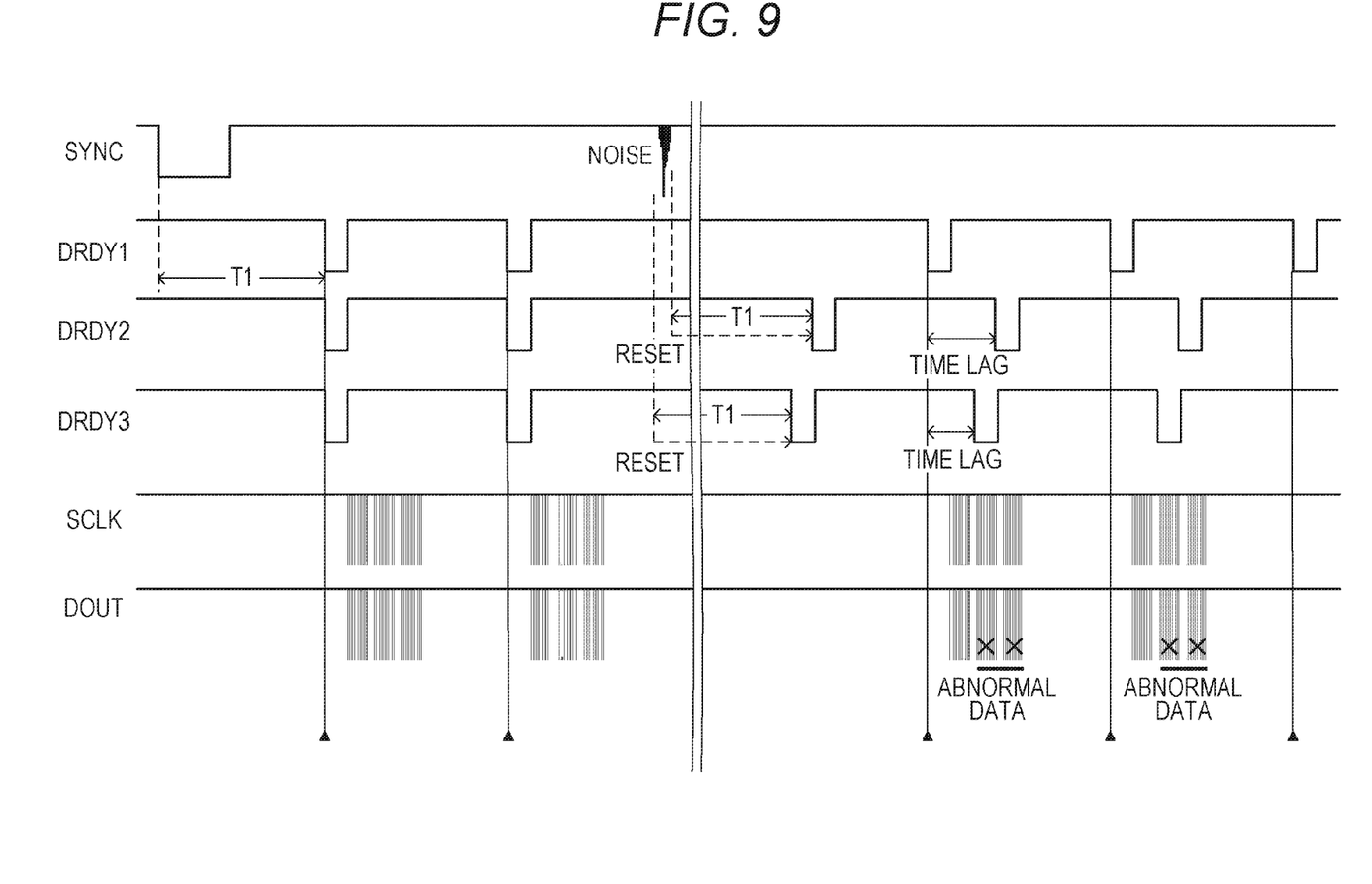
FIG. 9 is a timing chart showing an operation of a signal processing circuit when a noise is superimposed on a SYNC signal.

FIG. 9 is an example of a timing chart when a noise is superimposed on a SYNC signal. In this example, the second ADC and the third ADC out of the three AD converters are influenced by a noise and reset at different timings. The first ADC is not influenced by a noise.

In this case, each of the second ADC and the third ADC performs conversion processing at a timing with the reference being the timing when it is reset. Therefore, conversion of each ADC is not synchronized and DRDY signals are not concurrently output. Therefore, when an MPU performs data acquisition process based on the DRDY signal output from the first ADC, there occurs a situation in which the MPU acquires unreliable data or does not acquire data. Accordingly, a mechanism to suppress synchronization mismatch of conversion is required.

One object of the present disclosure is to suppress synchronization mismatch of conversion of an AD converter in a signal processing circuit including a plurality of daisy chain-connected AD converters.

A signal processing circuit according to an aspect of the present disclosure (the present signal processing circuit) includes: a plurality of daisy chain-connected AD converters each including a data ready output terminal, a synchronizing signal input terminal, and a serial clock input terminal; a calculator connected to the data ready output terminal of any of the AD converters and for outputting a serial clock to the serial clock input terminal of each of the AD converters when a data ready signal is input; and a reset processor included in the calculator and for outputting a synchronizing signal to the synchronizing signal input terminal of each of the AD converters when an output time lag among data ready signals from each of the AD converters is detected for a predetermined number of times.

The reset processor may include a time difference detector connected to the data ready output terminal of each of the AD converters and for detecting existence of a difference in an input time of the data ready signal from each of the AD converters. The reset processor may detect the output time lag among the data ready signals from each of the AD converters based on the difference in the input time detected by the time difference detector.

Alternatively, the reset processor may detect the output time lag among the data ready signals from each of the AD converters based on an output of XOR circuit connected to the data ready output terminal of each of the AD converters.

Further alternatively, the present signal processing circuit may include two of the AD converters. The present signal processing circuit may further include an XOR circuit connected to the data ready output terminals of the two AD converters and for outputting an output signal of high level when one of the data ready signals from the two AD converters is input. The reset processor may detect the output time lag among the data ready signals from each of the AD converters based on the output signal of high level from the XOR circuit.

According to the present signal processing circuit, it is possible to suppress synchronization mismatch of conversion of an AD converter in a signal processing circuit including a plurality of daisy chain-connected AD converters.

Figure 1:
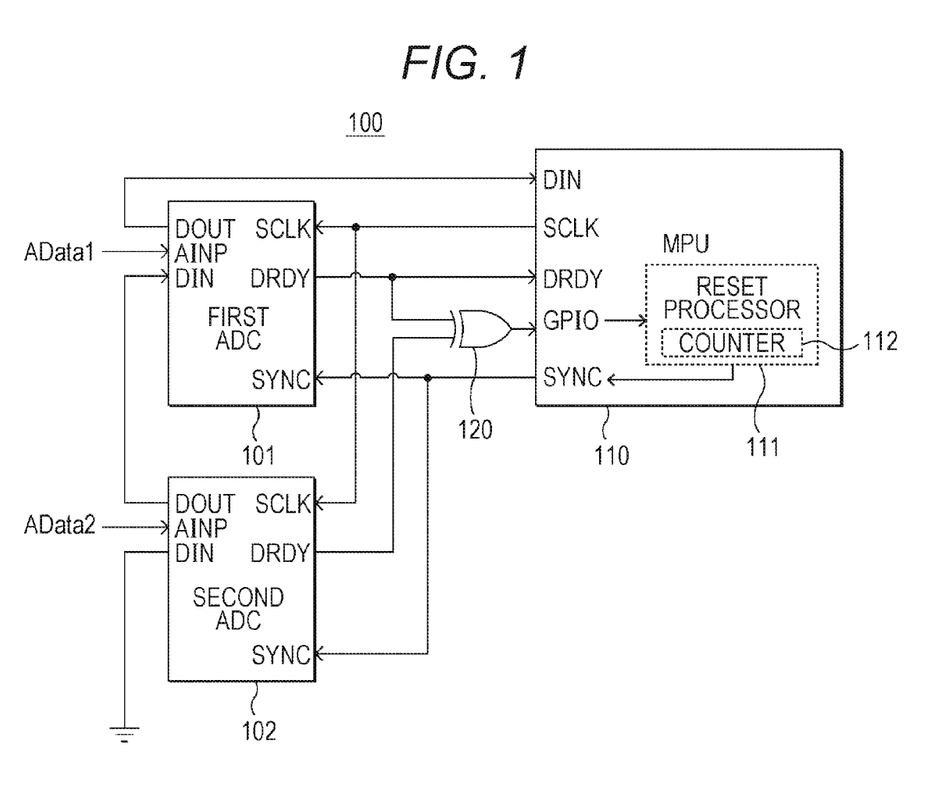
FIG. 1 illustrates a structure of a signal processing circuit according to the present embodiment.

An embodiment of the present disclosure will be described with reference to the drawings. FIG. 1 illustrates a structure of a signal processing circuit 100 according to the present embodiment. As illustrated in FIG. 1, the signal processing circuit 100 includes two AD converters (first ADC 101 and second ADC 102) and an MPU 110 as a calculator. The first ADC 101 and the second ADC 102 are daisy chain-connected. In the example of FIG. 1, a case in which two AD converters are daisy chain-connected is shown in order to simplify the description.

Each of the ADCs (101 and 102) may have the same structure as an AD converter accommodated to daisy chain connection known to the inventors. Each of the first ADC 101 and the second ADC 102 includes an analog input terminal (AINP), a digital output terminal (DOUT), a digital input terminal (DIN), a synchronizing signal input terminal (SYNC), a serial clock input terminal (SCLK), and a data ready output terminal (DRDY).

The MPU 110 includes a digital input terminal (DIN), a serial clock output terminal (SCLK), a data ready input terminal (DRDY), a general-purpose input output terminal (GPIO), and a synchronizing signal output terminal (SYNC). Moreover, the MPU 110 includes a reset processor 111 including a counter 112.

Each of the ADCs (101 and 102) becomes a reset state when a negative pulse is applied to the synchronizing signal input terminal (SYNC). In the example of FIG. 1, a synchronizing signal pulse output from the synchronizing signal output terminal (SYNC) of the MPU 110 is concurrently applied to the synchronizing signal input terminals (SYNC) of the ADCs (101 and 102). Accordingly, the first ADC 101 and the second ADC 102 are synchronized. That is, conversion of the first ADC 101 and conversion of the second ADC 102 are synchronized. The first ADC 101 and the second ADC 102 that are synchronized convert analog data input to the analog input terminal (AINP) to digital data. Moreover, the first ADC 101 and the second ADC 102 shift out conversion data (digital data) from the digital output terminal (DOUT) at a falling edge of the SCLK. The SCLK output from the serial clock output terminal (SCLK) of the MPU 110 is concurrently input to the serial clock input terminals (SCLK) of the ADCs (101 and 102).

Furthermore, in daisy chain connection, the first ADC 101 and the second ADC 102 shift in digital data from the digital input terminal (DIN) at a falling edge of the SCLK. The data that has been shifted in is shifted out from the digital output terminal (DOUT) after conversion data is shifted out.

In the example of FIG. 1, the digital output terminal (DOUT) of the first ADC 101 is connected to the digital input terminal (DIN) of the MPU 110. The digital output terminal (DOUT) of the second ADC 102 is connected to the digital input terminal (DIN) of the first ADC 101. The digital input terminal (DIN) of the second ADC 102 is grounded. However, the digital output terminal (DOUT) of the first ADC 101 may be connected to a digital input terminal (DIN) of another calculator.

When the ADCs (101 and 102) are data ready for reading (that is, when they are ready to read data), the ADCs (101 and 102) set the data ready output terminal (DRDY) as low level. Only the data ready output terminal (DRDY) of the first ADC 101 is connected to the data ready input terminal (DRDY) of the MPU 110. However, only the data ready output terminal (DRDY) of the second ADC 102 may be connected to the data ready input terminal (DRDY) of the MPU 110.

In the present embodiment, data ready output terminals (DRDY) of the ADCs (101 and 102) are connected to an input terminal of an XOR circuit 120. An output signal from the XOR circuit 120 is input to the general-purpose input output terminal (GPIO) of the MPU 110. Then the reset processor 111 included in the MPU 110 performs processing according to the signal input to the general-purpose input output terminal (GPIO).

The XOR circuit 120 outputs an output signal of high level only when one of a DRDY signal from the first ADC 101 and a DRDY signal from the second ADC 102 is input. That is, the XOR circuit 120 inputs a DRDY signal from the ADCs (101 and 102), and detects existence of a difference in input time of the DRDY signal from the ADCs (101 and 102). The XOR circuit 120 outputs an output signal of high level when the XOR circuit 120 detects a difference in the input time.

Inputting one of the DRDY signal from the first ADC 101 and the DRDY signal from the second ADC 102 by the XOR circuit 120 means that synchronization mismatch occurs between the first ADC 101 and the second ADC 102 (there is an output time lag between the DRDY signals from the first ADC 101 and the second ADC 102). Therefore, the reset processor 111 monitors a level of the output signal of the XOR circuit 120 so that synchronization mismatch between the first ADC 101 and the second ADC 102 can be detected.

The reset processor 111 of the MPU 110 detects synchronization mismatch between the first ADC 101 and the second ADC 102 based on the change of the level of the output signal from the XOR circuit 120 input to the general-purpose input output terminal (GPIO) to high level. Specifically, the reset processor 111 is only required to detect a rising edge or a falling edge of the signal input to the general-purpose input output terminal (GPIO).

Figure 2:
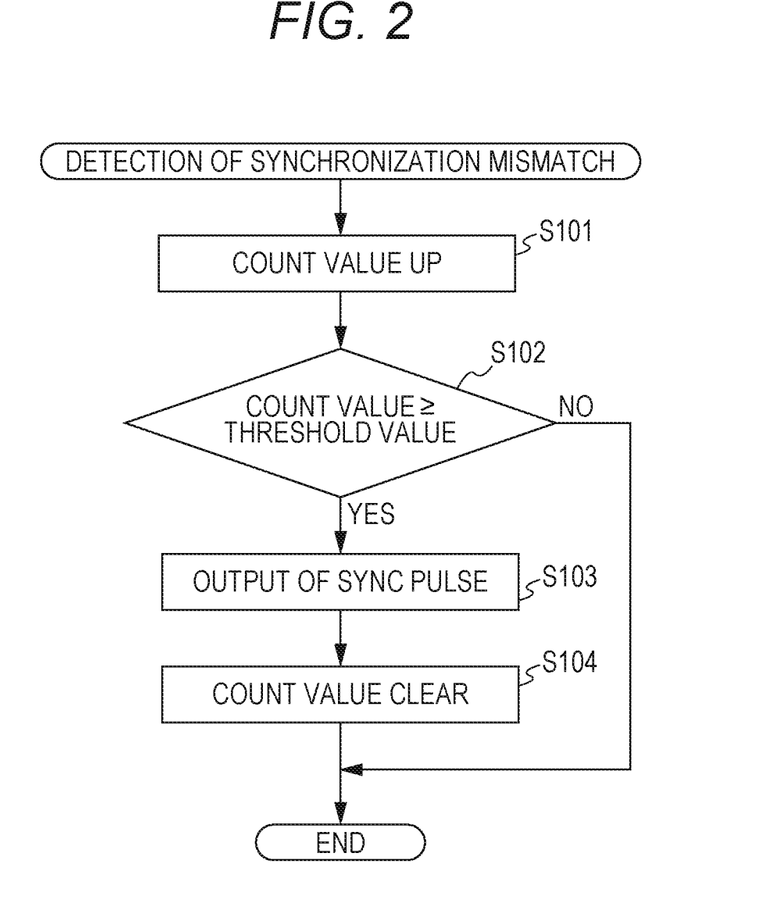
FIG. 2 is a flow chart showing an operation of a reset processor when synchronization mismatch is detected.

FIG. 2 is a flow chart showing an operation of the reset processor 111 when synchronization mismatch is detected. The reset processor 111 detects synchronization mismatch between the first ADC 101 and the second ADC 102 when the output signal from the XOR circuit 120 input to the general-purpose input output terminal (GPIO) is changed to high level. At this time, the reset processor 111 increases a count value of the counter 112 (S101).

If the count value of the counter 112 is equal to or more than the predetermined threshold value (S102: Yes), the reset processor 111 outputs a synchronizing signal pulse from the synchronizing signal output terminal (SYNC) (S103). By this means, the reset processor 111 resets the ADCs (101 and 102). Accordingly, synchronization mismatch between the ADCs (101 and 102) is resolved. The reset processor 111 clears the count value of the counter 112 (S104).

Any value can be set as the threshold value. For example, the reset processor 111 may reset the ADCs (101 and 102) when the output signal from the XOR circuit 120 changes to high level at least once. In this case, "1" is set as the threshold value. Moreover, in this case, the counter 112 may be omitted. On the other hand, if the ADCs (101 and 102) are reset when the possibility of occurrence of synchronization mismatch is very high, a relatively large value may be set as the threshold value.

Figure 3:
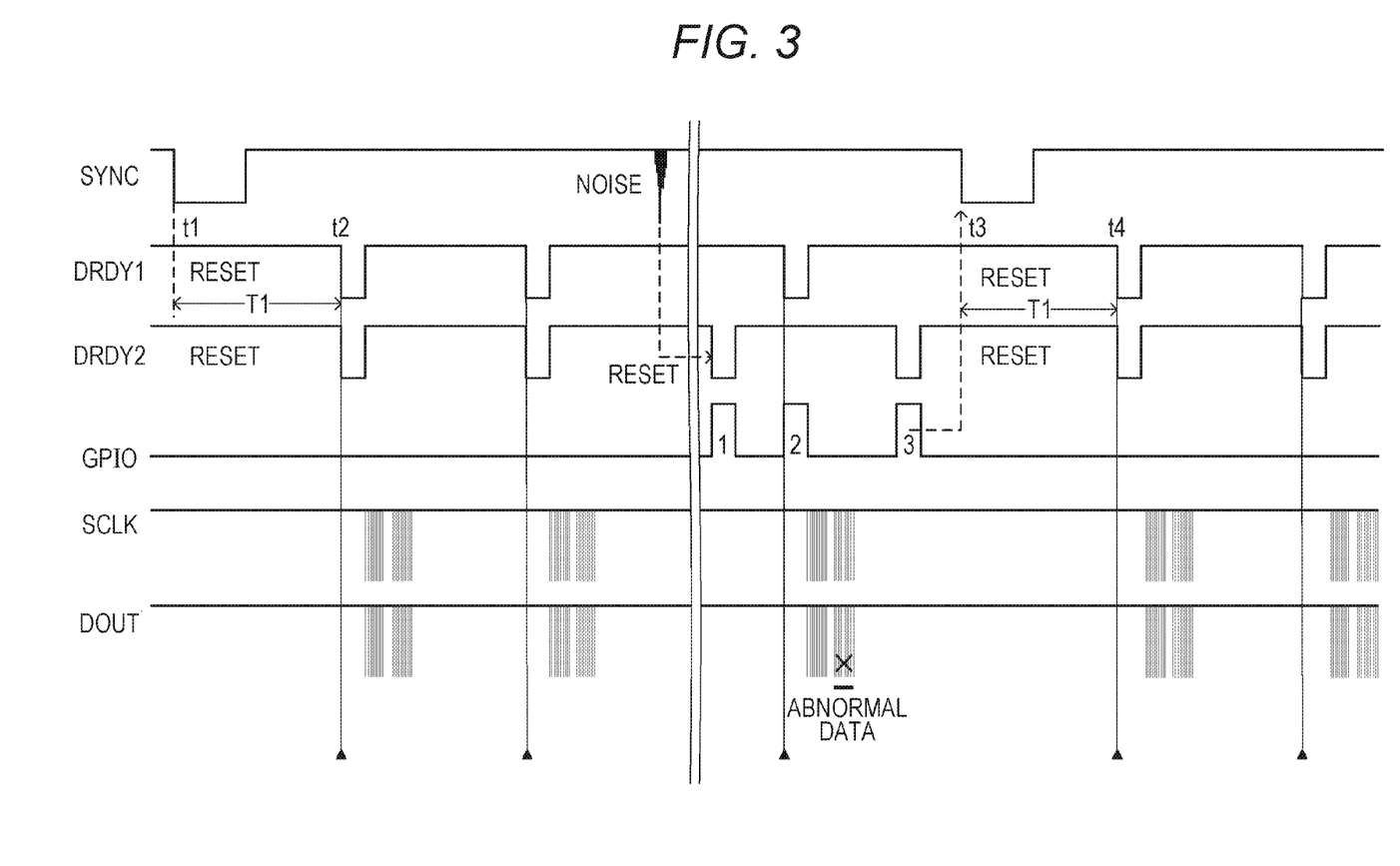
FIG. 3 is a timing chart showing an operation of a signal processing circuit when a noise is superimposed on a SYNC signal in the signal processing circuit according to the present embodiment.

FIG. 3 is a timing chart showing an operation of the signal processing circuit 100 when a noise is superimposed on a SYNC signal (SYNC signal line) in the signal processing circuit 100 according to the present embodiment. Here, it is assumed that "3" is set as the threshold value.

As shown in FIG. 3, each of the ADCs (101 and 102) is concurrently reset when a pulse is applied to the synchronizing signal input terminal (SYNC) at a time t1. The ADCs (101 and 102) perform digital conversion at the same timing and simultaneously output a DRDY signal at a time t2 after the predetermined period T1. Only the DRDY signal output from the first ADC 101 is input to the data ready input terminal (DRDY) of the MPU. The DRDY signals from the ADCs (101 and 102) are concurrently input to the XOR circuit 120. Therefore, the output signal of the XOR circuit 120 input to the general-purpose input output terminal (GPIO) is kept as low level.

Thereafter, it is assumed that a noise is superimposed on the SYNC signal (SYNC signal line), the first ADC 101 is not influenced by the noise, and the second ADC 102 is influenced by the noise to be reset.

Each of the first ADC 101 and the second ADC 102 performs conversion processing at a timing with the reference being the timing when it is reset. Therefore, conversion is not synchronized between the first ADC 101 and the second ADC 102. There is an output time lag between the DRDY signal output from the first ADC 101 and the DRDY signal output from the second ADC 102. Therefore, the output signal from the XOR circuit 120 input to the general-purpose input output terminal (GPIO) changes to high level while one of the DRDY signals (in FIG. 3, DRDY1 signal or DRDY2 signal) is being output.

The reset processor 111 of the MPU 110 counts the number of change of the output signal from the XOR circuit 120 to high level by the counter 112. When the count value becomes "3," which is set as the threshold value, the reset processor 111 (MPU 110) outputs a synchronizing signal pulse from the synchronizing signal output terminal (SYNC) (time t3). By this means, the first ADC 101 and the second ADC 102 are concurrently reset. Therefore, synchronization mismatch between the first ADC 101 and the second ADC 102 is resolved. As a result, DRDY signals are concurrently output from the first ADC 101 and the second ADC 102 at a time t4 after the predetermined period T1 from the time t3.

As described above, according to the signal processing circuit 100 of the present embodiment, the MPU 110 (reset processor 111) monitors data ready signals output from the first ADC 101 and the second ADC 102. Accordingly, the MPU 110 (reset processor 111) detects synchronization mismatch of conversion of the first ADC 101 and conversion of the second ADC 102 (output time lag between data ready signals from the first ADC 101 and the second ADC 102). When the MPU 110 (reset processor 111) detects synchronization mismatch of conversion (for example, when the number of detection of synchronization mismatch of conversion reaches the predetermined number of times (equal to or more than threshold value)), the first ADC 101 and the second ADC 102 are reset. As a result, it is possible to suppress synchronization mismatch of conversion of the first ADC 101 and conversion of the second ADC 102.

As described, according to the present embodiment, it is possible to suppress mismatch of conversion synchronization between AD converters in a signal processing circuit including a plurality of daisy chain-connected AD converters.

Figure 4:
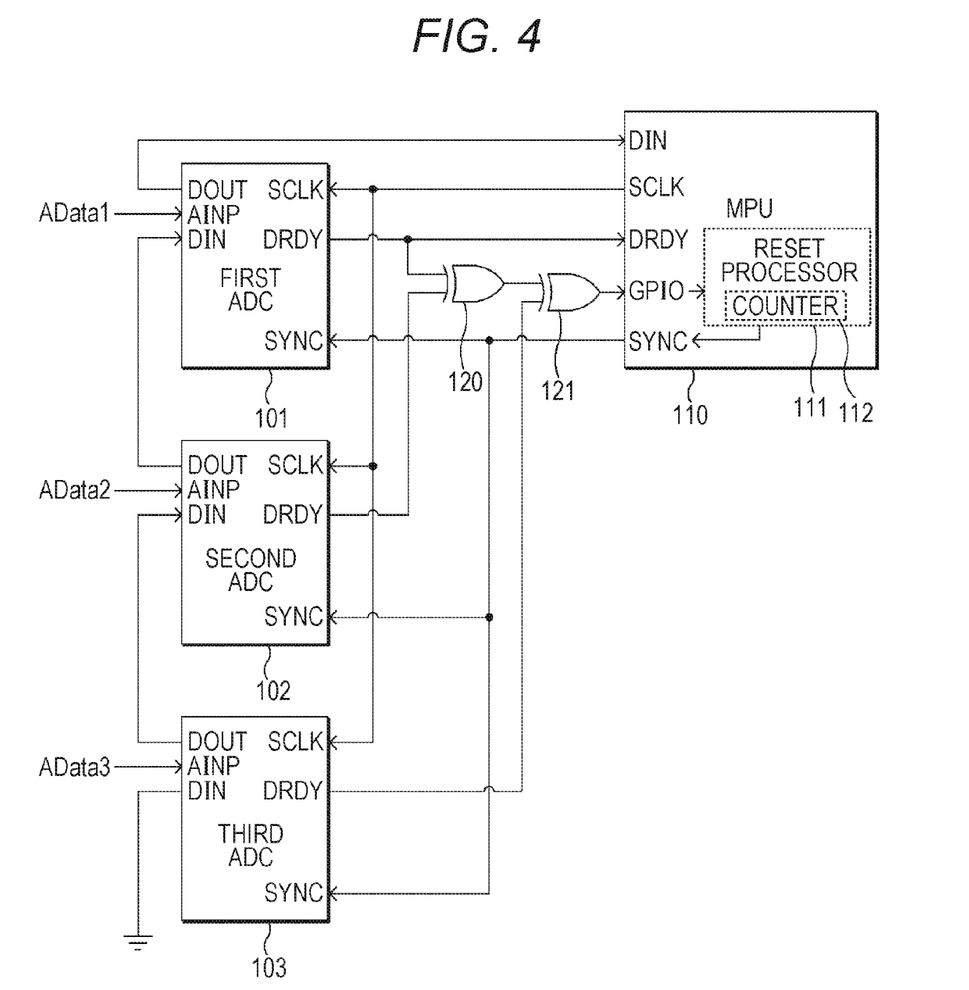
FIG. 4 illustrates a structure of a signal processing circuit including three AD converters.

In the example described above, the number of AD converters is two. However, the number of AD converters may be three or more. FIG. 4 illustrates a signal processing circuit including three daisy chain-connected AD converters (first ADC 101, second ADC 102, and third ADC 103). In the example of FIG. 4, data ready output terminals (DRDY) of the first ADC 101 and the second ADC 102 are connected to the input terminal of an XOR circuit (first XOR circuit) 120. An output terminal of the XOR circuit 120 and the data ready output terminal (DRDY) of the third ADC 103 are connected to an input terminal of a second XOR circuit 121. An output signal from the second XOR circuit 121 is input to a general-purpose input output terminal (GPIO) of a MPU 110. When three or more AD converters are daisy chain-connected, XOR circuits may be connected in multi stages so that DRDY signals from each AD converter pass through the XOR circuits.

Figure 5:
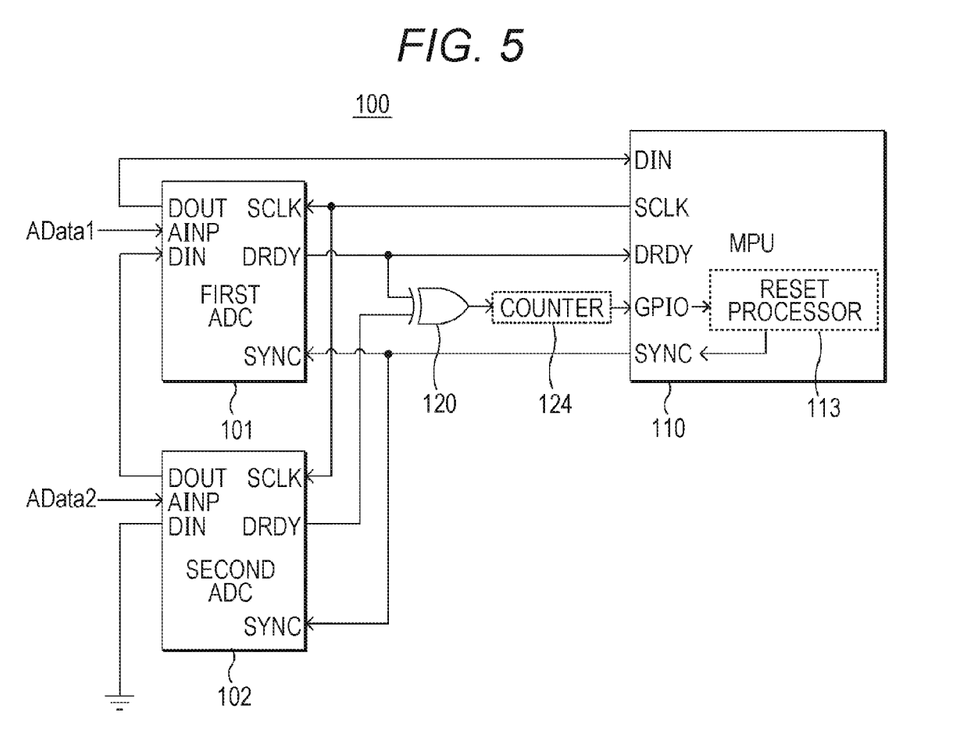
FIG. 5 illustrates the first modification of a signal processing circuit.

FIG. 5 illustrates the first modification of the signal processing circuit 100 illustrated in FIG. 1. In the first modification, a counter 124 is provided outside the MPU 110 (for example, between the XOR circuit 120 and the MPU 110). The counter 124 counts the number of change of an output signal from the XOR circuit 120 to high level.

The reset processor 113 of the MPU 110 monitors the count value of the counter 124. The reset processor 113 (MPU 110) outputs a synchronizing signal pulse from the synchronizing signal output terminal (SYNC) when the count value of the counter 124 becomes equal to or more than the predetermined threshold value. Alternatively, the threshold value may be set in the counter 124. In this case, when the count value becomes equal to or more than the threshold value, the counter 124 may notify the reset processor 113 of that.

Figure 6:
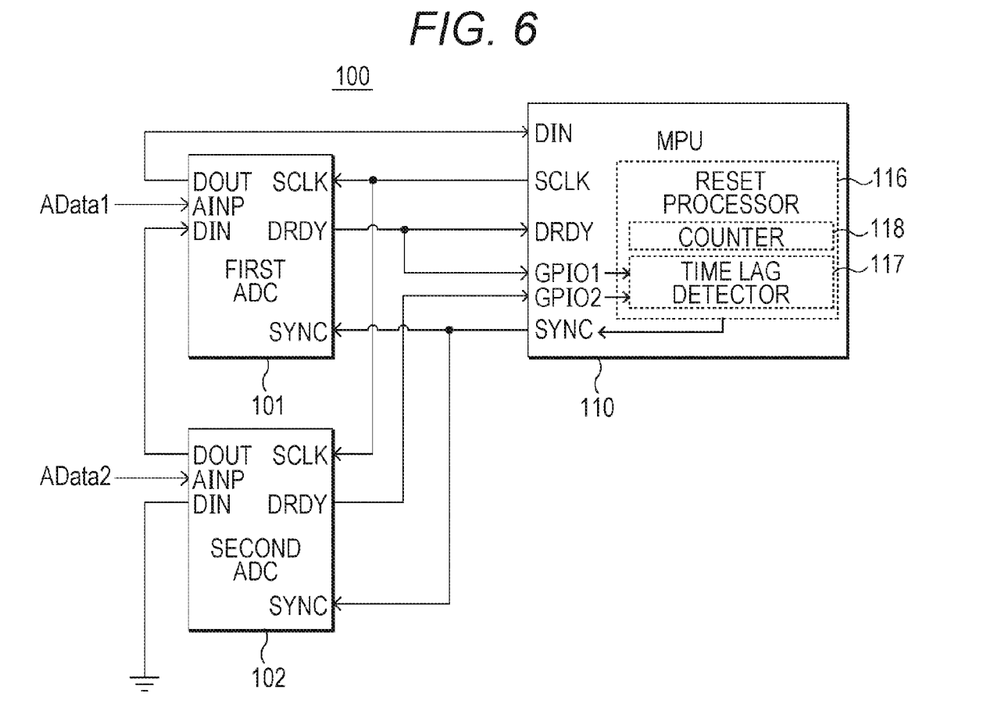
FIG. 6 illustrates the second modification of a signal processing circuit.

FIG. 6 illustrates the second modification of the signal processing circuit 100 illustrated in FIG. 1. The signal processing circuit 100 according to the second modification does not include an XOR circuit. In this signal processing circuit 100, DRDY signals from each AD converter are directly input to the general-purpose input terminals (GPIO1 and GPIO2) of the MPU 110.

A reset processor 116 of the MPU 110 includes a time difference detector 117 in addition to a counter 118. The time difference detector 117 is a block for detecting existence of a difference between a time when a DRDY signal is input to the general-purpose input terminal GPIO1 from the first ADC 101 and a time when a DRDY signal is input to the general-purpose input terminal GPIO2 from the second ADC 102. The reset processor 116 detects mismatch of conversion synchronization between the first ADC 101 and the second ADC 102 (output time lag between DRDY signals from the ADCs (101 and 102)) based on the difference in input time detected by the time difference detector 117.

The time difference detector 117 may include a timer having a function to capture an edge timing of an input signal, for example. The reset processor 116 (time difference detector 117) determines that synchronization mismatch occurs when capture times of edge timings of two input signals are different from each other.

That is, the result of detection by the time difference detector 117 has the same meaning as the output signal of the XOR circuit 120. Therefore, the MPU 110 (reset processor 116) counts the number of detection of synchronization mismatch by the time difference detector 117 by the counter 118. The MPU 110 (reset processor 116) outputs a synchronizing signal pulse from the synchronizing signal output terminal (SYNC) when the count value becomes equal to or more than the threshold value.

Also in these modifications, the signal processing circuit (MPU 110 (reset processor 116)) monitors data ready signals output from each AD converter to detect mismatch of conversion synchronization between the AD converters. The signal processing circuit (MPU 110 (reset processor 116)) resets AD conversion when synchronization mismatch of conversion is detected. Therefore, it is possible to suppress mismatch of conversion synchronization between AD converters. As described above, according to these modifications, it is possible to suppress mismatch of conversion synchronization between AD converters in a signal processing circuit including a plurality of daisy chain-connected AD converters.

A signal processing circuit according to the present embodiment may be one of the following first to third signal processing circuits.

The first signal processing circuit is a signal processing circuit in which a plurality of AD converters including a data ready output terminal, a synchronizing signal input terminal, and a serial clock input terminal are daisy chain-connected. The first signal processing circuit includes a calculator that is connected to the data ready output terminal of any of the AD converters, outputs a serial clock to the serial clock input terminal of each AD converter when a data ready signal is input, and outputs a synchronizing signal to the synchronizing signal input terminal of each AD converter when difference in data ready signals output from data ready output terminals of each AD converter is detected for the predetermined number of times.

The second signal processing circuit is the first signal processing circuit, in which the calculator is connected to data ready output terminal of each AD converter and detects a difference in data ready signal based on the time difference of output of data ready signals by each data ready output terminal.

The third signal processing circuit is the first signal processing circuit, in which the calculator detects a difference in the data ready signal based on the output of an XOR circuit connected to the data ready output terminals of each AD converter.

According to the first to third signal processing circuits, it is possible to suppress mismatch of conversion synchronization between AD converters in a signal processing circuit in which a plurality of AD converters is daisy chain-connected.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A signal processing circuit comprising:
   a plurality of daisy chain-connected AD converters each including a data ready output terminal, a synchronizing signal input terminal, and a serial clock input terminal;
   a calculator connected to the data ready output terminal of any of the AD converters and for outputting a serial clock to the serial clock input terminal of each of the AD converters when a data ready signal is input; and
   a reset processor included in the calculator and for outputting a synchronizing signal to the synchronizing signal input terminal of each of the AD converters when an output time lag among data ready signals from each of the AD converters is detected for a predetermined number of times.

2. The signal processing circuit according to claim 1, wherein
   the reset processor includes a time difference detector connected to the data ready output terminal of each of the AD converters and for detecting existence of a difference in an input time of the data ready signal from each of the AD converters, and
   the reset processor detects the output time lag among the data ready signals from each of the AD converters based on the difference in the input time detected by the time difference detector.

3. The signal processing circuit according to claim 1, wherein
   the reset processor detects the output time lag among the data ready signals from each of the AD converters based on an output of XOR circuit connected to the data ready output terminal of each of the AD converters.

4. The signal processing circuit according to claim 1, comprising
   two of the AD converters, wherein
   the signal processing circuit further includes an XOR circuit connected to the data ready output terminals of the two AD converters and for outputting an output signal of high level when one of the data ready signals from the two AD converters is input, and
   the reset processor detects the output time lag among the data ready signals from each of the AD converters based on the output signal of high level from the XOR circuit.

* * * * *